United States Patent
Kim et al.

(10) Patent No.: US 9,859,352 B2
(45) Date of Patent: Jan. 2, 2018

(54) TRANSPARENT ORGANIC LIGHT EMITTING DISPLAY DEVICE AND METHOD OF MANUFACTURING THE SAME

(71) Applicant: LG DISPLAY CO., LTD., Seoul (KR)

(72) Inventors: JongSung Kim, Paju-si (KR); Jiho Ryu, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 179 days.

(21) Appl. No.: 14/753,816

(22) Filed: Jun. 29, 2015

(65) Prior Publication Data

US 2016/0163770 A1    Jun. 9, 2016

(30) Foreign Application Priority Data

Dec. 5, 2014    (KR) ........................ 10-2014-0174506

(51) Int. Cl.
    *H01L 27/32*          (2006.01)

(52) U.S. Cl.
    CPC ........ *H01L 27/326* (2013.01); *H01L 27/3218* (2013.01); *H01L 27/3246* (2013.01)

(58) Field of Classification Search
    CPC ............... H01L 27/326; H01L 27/3218; H01L 27/3246

See application file for complete search history.

(56) References Cited

U.S. PATENT DOCUMENTS

| | | | | |
|---|---|---|---|---|
| 2008/0062096 A1* | 3/2008 | Yamashita | ........... | G09G 3/2074 345/82 |
| 2011/0147770 A1* | 6/2011 | Hwang | ................. | H01L 27/326 257/89 |

* cited by examiner

*Primary Examiner* — Donald Raleigh
*Assistant Examiner* — Kevin Quarterman
(74) *Attorney, Agent, or Firm* — Dentons US LLP

(57) ABSTRACT

Disclosed is a transparent organic light-emitting display (OLED) device having improved resolution by changing the layout of sub-pixel regions in a light-emitting area. The device comprises: a substrate having a plurality of pixels, each pixel including: a light emitting area including a first sub-pixel region, a second sub-pixel region, and a third sub-pixel region; and a transmissive area through which external light passes, wherein the transmissive area is surrounded by edges of the first, second and third sub-pixel regions of the pixel; and an organic light-emitting element on thin film transistors in each of the sub-pixel regions, wherein the first sub-pixel region is arranged on a first line of the pixel extending in a first direction, the second sub-pixel region is arranged on a second line parallel to the first direction, and the third sub-pixel region is arranged on a third line extending in a second direction.

18 Claims, 11 Drawing Sheets

TRANSPARENT ORGANIC LIGHT EMITTING DISPLAY DEVICE AND METHOD OF MANUFACTURING THE SAME

CROSS-REFERENCE TO RELATED APPLICATIONS

This application claims the priority of Korean Patent Application No. 2014-0174506 filed on Dec. 5, 2014, in the Korean Intellectual Property Office, the disclosure of which is incorporated herein by reference for all purposes as if fully set forth herein.

BACKGROUND OF THE INVENTION

Field of the Invention

The present disclosure relates to a transparent organic light-emitting display device and a method of manufacturing the same. More specifically, the present disclosure relates to a transparent organic light-emitting display device with improved transmissivity of transmissive areas, and a method of manufacturing such a transparent organic light-emitting display device.

Description of the Related Art

An organic light-emitting display (OLED) device, unlike a liquid crystal display (LCD) device, is a self light-emitting device. Accordingly, an OLED device does not require a separate light source. Thus, an OLED device can be made thinner than an LCD device. Further, an OLED device has advantages in that it is driven with low voltage to consume less power, realizes excellent color expression capability, has high response time, wide viewing angle and high contrast ratio (CR). For these reasons, an OLED device is currently under development as the next generation display device.

To keep pace with consumers' diversified demands, there have been attempts to make such an OLED device to be transparent (or have a certain degree of transparency), i.e., a transparent organic light-emitting display device. A transparent OLED device includes a plurality of pixels, each of the pixels is divided into a light-emitting area in which organic light-emitting elements produce light to display images, and a transmissive area through which external light passes. Transparency of the transparent OLED device is obtained by the transmissive area.

Previously, it was common in manufacturing a transparent OLED by placing red sub-pixel regions, green sub-pixel regions and blue sub-pixel regions in a parallel arrangement with one another, i.e., in a stripe pattern. In this regard, a fine metal mask (FMM) is used to form organic light-emitting layers in the sub-pixel regions arranged in a stripe pattern. As transparent OLEDs are required to have high resolution, the gap between the openings of the FMM has to be narrower when compared to non-transparent OLEDs. As the width between the openings becomes narrower, problems may occur due to the openings of the metal mask being blocked by organic material during the manufacturing process. Also, the required partition between immediately adjacent sub-pixels may be difficult to obtain due to a shadowing phenomenon with respect to the metal mask. Additionally, maintaining the necessary metal mask rigidity is difficult.

Due to such issues related to the mask, many defects can occur in transparent OLED devices. Under such circumstances, in order to obtain sufficient aperture ratio of light-emitting areas to achieve high resolution while also obtaining sufficient aperture ratio of transmissive areas to improve transparency of a transparent OLED device, a transparent OLED device having a novel layout of sub-pixel regions is required.

SUMMARY OF THE INVENTION

The inventors of the application have developed a novel structure of a transparent OLED device including a novel layout of sub-pixel regions in a light-emitting area, and a method of manufacturing the same. This novel structure is made to overcome the difficulties related to deposition of organic light-emitting layers in sub-pixel regions by using an FMM to obtain high resolution and a desired aperture ratio of a transparent OLED device.

In view of the above, an advantage of the present invention is to provide a transparent OLED device having a large width between openings of a mask for deposition of organic light-emitting layers in sub-pixel regions, while achieving high resolution, and a method of manufacturing a transparent OLED.

Another advantage of the present disclosure is to provide a transparent OLED device having approved aperture ratios of light-emitting areas and transmissive areas while achieving high resolution, and a method of manufacturing a transparent OLED.

It should be noted that advantages of the present invention are not limited to the above-described advantages, and other advantages of the present invention will be apparent to those skilled in the art from the following descriptions.

According to an aspect of the present disclosure, there is provided a transparent organic light-emitting display (OLED) device, comprising: a substrate having a plurality of pixels, each pixel including: a light emitting area including a first sub-pixel region, a second sub-pixel region, and a third sub-pixel region, each of the sub-pixel regions emitting light of a different color from each other; and a transmissive area through which external light passes, wherein the transmissive area is surrounded by edges of the first, second and third sub-pixel regions of the pixel; a plurality of thin film transistors on the substrate and corresponding to each of the sub-pixel regions; and an organic light-emitting element on the thin film transistors in each of the sub-pixel regions, the organic light-emitting element producing light to display images, wherein light-emitting layers emitting light of a same color are arranged in adjacent sub-pixel regions, wherein the first sub-pixel region is arranged on a first line of the pixel extending in a first direction, the second sub-pixel region is arranged on a second line parallel to the first direction, and the third sub-pixel region is arranged on a third line extending in a second direction.

According to another aspect of the present disclosure, there is provided a transparent organic light-emitting display (OLED) device, comprising: a substrate having a plurality of pixels, each pixel including: a light emitting area including a first sub-pixel region, a second sub-pixel region, and a third sub-pixel region, each of the sub-pixel regions configured to emit light of a different color from each other; and a transmissive area through which external light passes, wherein the light emitting area surrounds the transmissive area with the first sub-pixel region extended along a first edge of the transmissive area, the second sub-pixel region extended along a second edge of the transmissive area, and the third sub-pixel region extended along a third edge of the transmissive area

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE ILLUSTRATED EMBODIMENT

Figure 1:
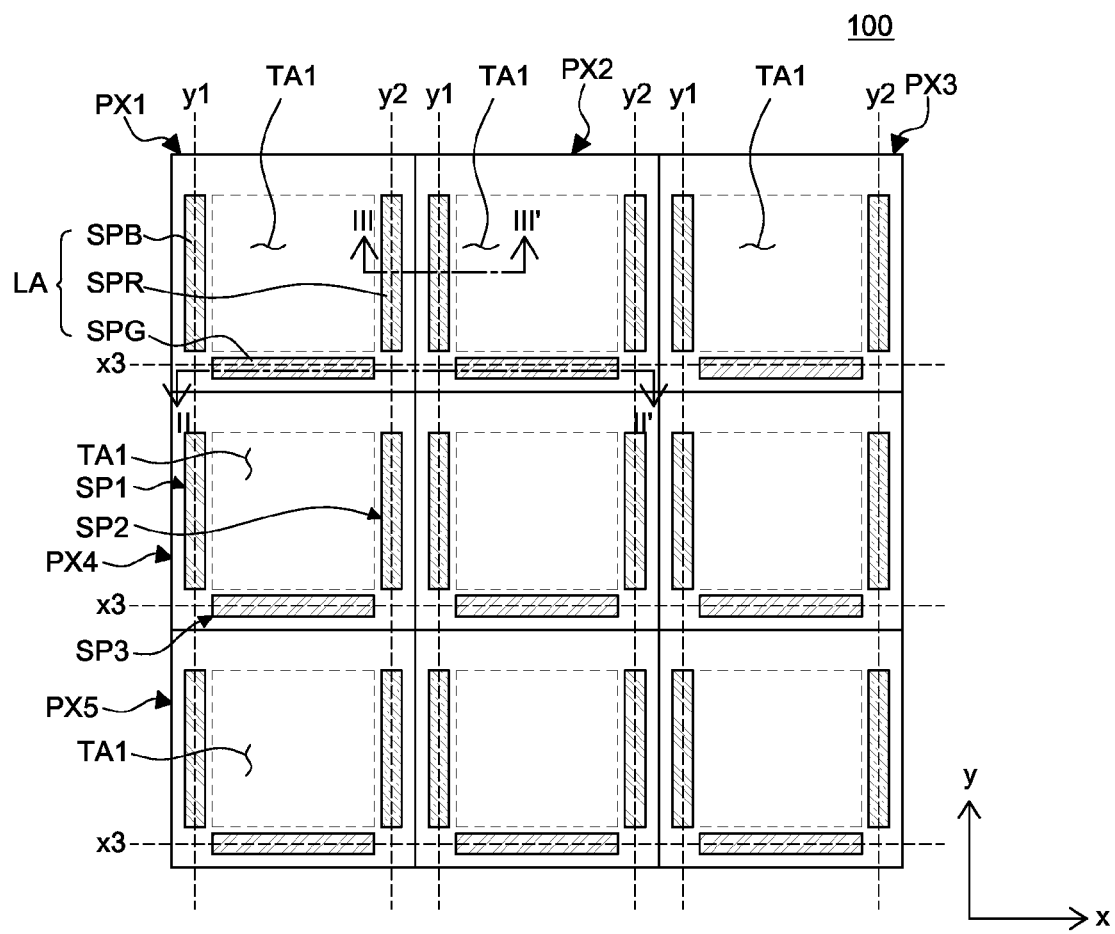
FIG. 1 is a schematic plan view illustrating a transparent OLED device according to an exemplary embodiment of the present disclosure.

Advantages and features of the present invention and methods to achieve them will become apparent from the descriptions of exemplary embodiments herein below with reference to the accompanying drawings. However, the present invention is not limited to exemplary embodiments disclosed herein but may be implemented in various different forms. The exemplary embodiments are provided for making the disclosure of the present invention thorough and for fully conveying the scope of the present invention to those skilled in the art. It is to be noted that the scope of the present invention is defined only by the claims.

Advantages and features of the present invention and methods to achieve them will become apparent from the descriptions of exemplary embodiments herein below with reference to the accompanying drawings. However, the present invention is not limited to exemplary embodiments disclosed herein but may be implemented in various different ways. The exemplary embodiments are provided for making the disclosure of the present invention thorough and for fully conveying the scope of the present invention to those skilled in the art. It is to be noted that the scope of the present invention is defined only by the claims.

The figures, dimensions, ratios, angles, numbers of elements given in the drawings are merely illustrative and are not limiting. Further, in describing the present invention, descriptions on well-known technologies may be omitted in order not to obscure the gist of the present invention. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present invention.

Like reference numerals denote like elements throughout the descriptions.

The drawings are not to scale and the relative dimensions of various elements in the drawings are depicted schematically and not necessarily to scale.

Features of various exemplary embodiments of the present invention may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
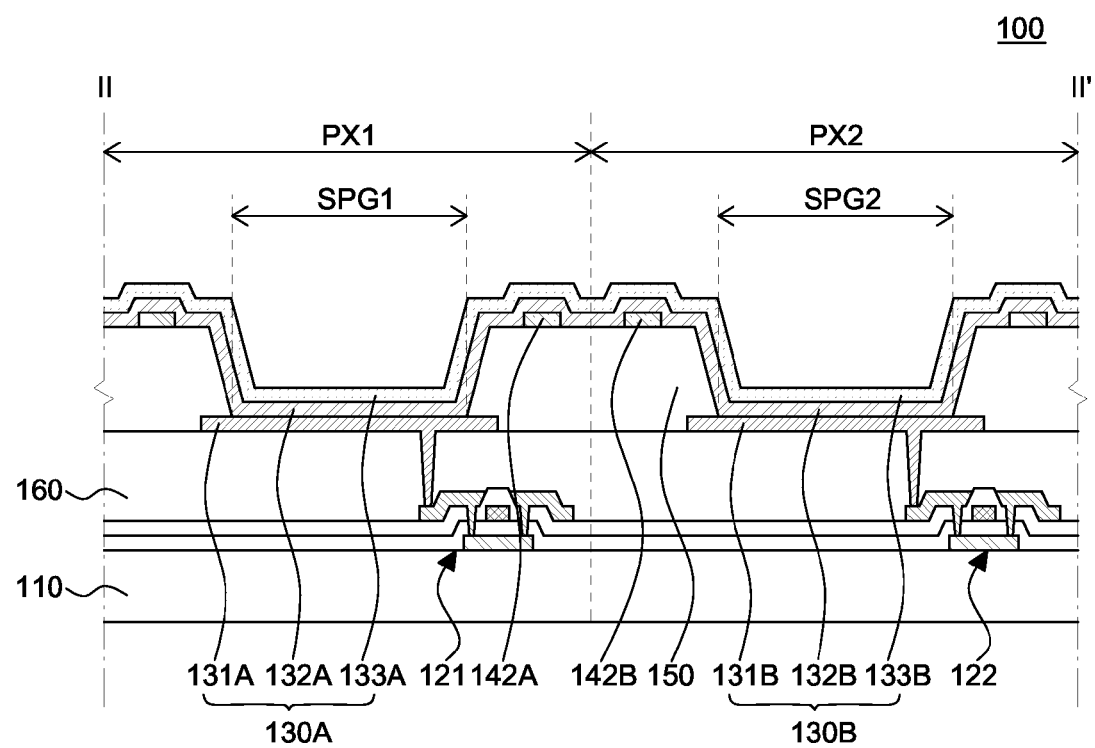
FIG. 2 is a cross-sectional view of the transparent OLED, taken along line II-II' of FIG. 1.
Figure 3:
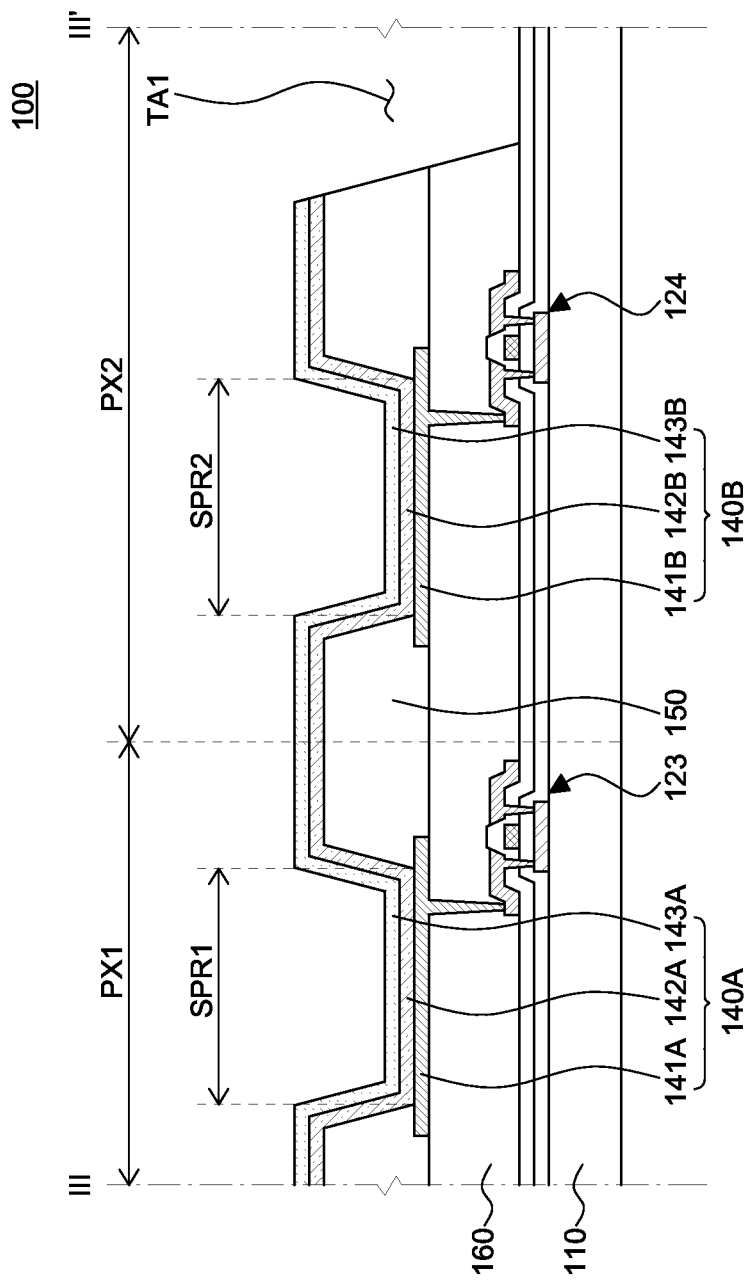
FIG. 3 is a cross-sectional view of the transparent OLED, taken along line III-III' of FIG. 1.

FIG. 1 is a schematic plan view illustrating a transparent OLED device according to an exemplary embodiment of the present disclosure. FIG. 2 is a cross-sectional view of the transparent OLED, taken along line II-II' of FIG. 1. FIG. 3 is a cross-sectional view of the transparent OLED, taken along line III-III' of FIG. 1.

Referring to FIG. 1, a transparent organic light-emitting display (OLED) 100 includes a plurality of pixels, for example, PX1, PX2, PX3 and PX4. In the transparent OLED device 100, each of the pixels includes a light-emitting area LA and a transmissive area TA. The light-emitting area LA includes a plurality of sub-pixel regions SPR, SPG and SPB.

Each of the sub-pixel regions SPR, SPG and SPB is a basic unit of light-emission of the light-emitting area LA. In a pixel PX1, for example, the different sub-pixel regions SPR, SPG and SPB emit light of different colors from each other. Specifically, each of the sub-pixel regions SPR, SPG and SPB emits one of red light, green light and blue light. One pixel PX1 includes three sub-pixel regions, i.e., a red sub-pixel region SPR, a green sub-pixel region SPG and a blue sub-pixel region SPB.

As shown in FIG. 1, a first line y1 and a second line y2, which are parallel with the y-axis (i.e. column direction), are defined. In addition, a third line x3, which is parallel with the x-axis (i.e. row direction) and perpendicular to the y-axis, is defined. Accordingly, the third line x3 is extended in a different direction from that in which the first line y1 and the second line y2 are extended. Specifically, the third line x3 is perpendicular to the first line y1 and the second line y2.

It is also defined that a first sub-pixel region SP1 is disposed on the first line y1, a second sub-pixel region SP2 is disposed on the second line y2, and a third sub-pixel region SP3 is disposed on the third line x3. It is to be noted that the colors of the light emitted from the first sub-pixel region SP1, the second sub-pixel region SP2 and the third sub-pixel region SP3 are not limited to those illustrated herein. That is, the colors are given in order to distinguish among three or four sub-pixel regions in a pixel; and, therefore, the colors of the light emitted from the first sub-pixel region SP1, the second sub-pixel region SP2 and the third sub-pixel region SP3 may vary depending on exemplary embodiments.

Referring to FIG. 1, In the first pixel PX1, the fourth pixel PX4 and the fifth pixel PX5 which are a plurality of pixels arranged in the direction of the y-axis (namely, the column direction), the blue sub-pixel region SPB is disposed on the first line y1, the red sub-pixel region SPR is disposed on the second line y2, and the green sub-pixel region SPG is disposed on the third line x3. In the second pixel PX2 which is immediately adjacent to the first pixel PX1 in the direction of the x-axis, the blue sub-pixel region SPB is disposed on the second line y2, the red sub-pixel region SPR is disposed on the first line y1, and the green sub-pixel region SPG is disposed on the third line x3. Namely, in each of pixels, the blue sub-pixel region SPB is disposed along the first line y1, the red sub-pixel region SPR is disposed along the second line y2, and the green sub-pixel region SPG is disposed along the third line x3. Or, in each of pixels, the blue sub-pixel region SPB is disposed along the second line y2, the red sub-pixel region SPR is disposed along the first line y1, and the green sub-pixel region SPG is disposed along the third line x3. Accordingly, in each of the pixels, the blue sub-pixel region SPB are in parallel with the red sub-pixel region SPR, while the green sub-pixel region SPG is perpendicular to the blue sub-pixel region SPB and the red sub-pixel region SPR.

The colors of light emitted from the sub-pixel regions SPR, SPG and SPB may vary depending on organic light-emitting layers disposed in the sub-pixel regions SPR, SPG and SPB. The disposal of the organic light-emitting layers in the sub-pixel regions SPR, SPG and SPB will be described with reference to FIGS. 2 and 3.

The transmissive area TA1 is surrounded by the light-emitting area LA. In other words, the transmissive area TA1 is surrounded by the sub-pixel regions of a pixel. Specifically, at least three edges of the transmissive area TA1 are surrounded by the light-emitting area LA. In other words, for a pixel, at least three edges of a transmissive area of the pixel may be surrounded by sub-pixel regions of the pixel. For example, a sub-pixel region may be disposed for every side of a transmissive area TA1, respectively. Namely, three sub-pixel regions SP1, SP2 and SP3 of the fourth pixel PX4 may be disposed three sides of the transmissive area TA1 of the fourth pixel PX4, respectively, and a sub-pixel region SP3 of the first pixel PX1 immediately adjacent to the fourth pixel PX4 may be disposed a side of the transmissive area TA1 of the fourth pixel PX4. For example, a transmissive area TA1 of a pixel may be surrounded by the sub-pixel regions SPR, SPG and SPB of the pixel. In the example shown in FIG. 1 where only three sub-pixel regions SPR, SPG, and SPB are disposed in the first pixel PX1, there exists at least one side of the transmissive area TA1 on which no sub-pixel region of the first pixel PX1 is disposed. Specifically, each of the sub-pixels of the pixel can be disposed along the edges of the transmissive area TA1 of the pixel. Also, the transmissive area TA1 of the pixel is disposed in the center of the pixel and the light-emitting area LA of the pixel is disposed in the periphery of the pixel and surrounds at least three edges of the transmissive area TA1. Thus, every pixel may have at least one side that is an interface between two immediately adjacent light-emitting areas that emit same color and are located in two immediately adjacent pixels respectively.

Hereinafter, a cross-sectional structure of organic light-emitting layers disposed in the sub-pixel regions in the transparent OLED device 100 will be described with reference to FIG. 2.

Referring to FIG. 2, between a first pixel PX1 and a second pixel PX2 which is immediately adjacent to the first pixel PX1 in the direction of x-axis, the first green sub-pixel region SPG1 of the first pixel PX1 is arranged such that it is positioned immediately adjacent to the second green sub-pixel region SPG2 of the second pixel PX2. On a substrate 110 of the transparent OLED device 100, thin-film transistors 121 and 122 associated with the first green sub-pixel region SPG1 and the second green sub-pixel region SPG2, respectively, are disposed. On the thin film transistors 121 and 122, an overcoat layer 160 for covering an uneven top surface of the thin film transistors is disposed. On a flattened top surface of the overcoat layer 160, an anode 131A of the first green sub-pixel region SPG1 and an anode 131B of the second green sub-pixel region SPG2 are disposed. On the anode 131A of the first green sub-pixel region SPG1, an organic light-emitting layer 132A of the first green sub-pixel region SPG1 is disposed. On the organic light-emitting layer 132A of the first green sub-pixel region SPG1, a cathode of 133A of the first green sub-pixel region SPG1 is disposed. As a result, an organic light-emitting element 130A of the first green sub-pixel region SPG1 is formed. Likewise, on the anode 131B of the second green sub-pixel region SPG2, an organic light-emitting layer 132B of the second green sub-pixel region SPG2 is disposed. On the organic light-emitting layer 132B of the second green sub-pixel region SPG2, a cathode of 133B of the second green sub-pixel region SPG2 is disposed. As a result, an organic light-emitting element 130B of the second green sub-pixel region SPG2 is formed. Accordingly, in the immediately adjacent sub-pixel regions SPG1 and SPG2, green light is emitted by the organic light-emitting element 130A of the first green sub-pixel region SPG1 and the organic light-emitting element 130B of the second green sub-pixel region SPG2.

A bank layer 150 disposed between the first pixel PX1 and the second pixel PX2 covers a side end of the anode 131A of the first green sub-pixel region SPG1 and a side end of the anode 131B of the second green sub-pixel region SPG2. In addition, the bank layer 150 is overlaid from both of the first pixel PX1 and the second pixel PX2. The first pixel PX1 and the second pixel PX2 are separated by the bank layer 150. Also, the first green sub-pixel region SPG1 of the first pixel PX1 and the second green sub-pixel region SPG2 of the second pixel PX2 are defined by means of the bank layer 150.

Referring to FIG. 2, on the bank layer 150 disposed between the first pixel PX1 and the second pixel PX2, an organic light-emitting layer 142A of the first pixel PX1 and an organic light-emitting layer 142B of the second pixel PX2 are disposed. Specifically, the organic light-emitting layer 142A of the first pixel PX1 is disposed on a portion of the bank layer 150 in the first pixel PX1. The organic light-emitting layer 142A may be continuously arranged (or formed) across the bank layer 150 and the first red sub-pixel region SPR1 The organic light-emitting layer 142B of the second pixel PX2 is disposed on a portion of the bank layer 150 in the second pixel PX2. The organic light-emitting layer 142B may be continuously arranged (or formed) across the bank layer 150 and the second red sub-pixel region SPR2 In FIG. 2, on the bank layer 150 between the first pixel PX1 and the second pixel PX2, the organic light-emitting layer 132A of the first pixel PX1 corresponding to the bank layer 150 and the first green sub-pixel region SPG1 and the organic light-emitting layer 132B of the second pixel PX2 corresponding to the bank layer 150 and the second green sub-pixel region SPG2 partially cover the organic light-emitting layer 142A of the first pixel PX1 corresponding to the bank layer 150 and the first red sub-pixel region SPR1 and the organic light-emitting layer 142B of the second pixel PX2 corresponding to the bank layer 150 and the second red sub-pixel region SPR2, respectively. In other words, the overlapping area of the organic light-emitting layer 132A, 132B corresponding to the green color and the organic light-emitting layer 142A, 142B corresponding to the red color is formed on the bank layer 150. However, the positional relationship between organic light-emitting layers may vary depending on the order in which the organic light-emitting layers are stacked on one another, as necessary. An order in which the organic light-emitting layers are stacked on one another will be described with reference to FIGS. 8A to 8D.

Referring to FIG. 1, a pixel adjacent to the first pixel PX1 in the direction of the x-axis is referred to as a second pixel PX2. In addition, a pixel adjacent to the second pixel PX2 in the direction of the x-axis on the opposite side to the first pixel PX1 is referred to as a third pixel PX3.

Referring to FIG. 1, the sub-pixel regions, which are immediately adjacent to each other with respect to the boundary line between the pixels, may emit light of the same color. Specifically, a sub-pixel region disposed on the second line y2 of a pixel and a sub-pixel region disposed on the first line y1 of a pixel immediately adjacent to the pixel may emit light of the same color. For example, as shown in FIG. 1, the red sub-pixel region SPR of the second pixel PX2 may be disposed immediately adjacent to the red sub-pixel region SPR of the first pixel PX1. In other words, as shown in FIG. 3, the second red sub-pixel region SPR2 of the second pixel PX2 may be disposed immediately adjacent to the first red sub-pixel region SPR1 of the first pixel PX1. In addition, a blue sub-pixel region SPB of the third pixel PX3 immediately adjacent to the second pixel PX2 in the direction of the x-axis may be disposed immediately adjacent to a blue sub-pixel region SPB of the second pixel PX2.

Hereinafter, a cross-sectional structure of the immediately adjacent sub-pixel regions emitting light of the same color and the transmissive area in the transparent OLED device 100 will be described with reference to FIG. 3.

Referring to FIG. 3, between a first pixel PX1 and a second pixel PX2 adjacent to the first pixel PX1 in the direction of the x-axis, a first red sub-pixel region SPR1 of the first pixel PX1 is immediately disposed adjacent to a second red sub-pixel region SPR2 of the second pixel PX2. On a substrate 110 of the transparent OLED device 100, thin-film transistors 123 and 124 associated with the first red sub-pixel region SPR1 and the second red sub-pixel region SPR2, respectively, are disposed. On the thin film transistors 123 and 124, an overcoat layer 160 for covering an uneven top surface of the thin film transistors 123 and 124 is disposed. On a flattened top surface of the overcoat layer 160, an anode 141A of the first red green sub-pixel region SPR1 and an anode 141B of the second red sub-pixel region SPR2 are disposed. On the anode 141A of the first red sub-pixel region SPR1, an organic light-emitting layer 142A of the first red sub-pixel region SPR1 and a cathode 143A of the first red sub-pixel region SPR1 are stacked in this order to thereby form an organic light-emitting element 140A of the first red sub-pixel region SPR1. On the anode 141B of the second red sub-pixel region SPR2, an organic light-emitting layer 142B of the second red sub-pixel region SPR2 and a cathode 143B of the second red sub-pixel region SPR2 are stacked in this order to thereby form an organic light-emitting element 140B of the second red sub-pixel region SPR2.

The thin-film transistors 123 and 124 are electrically connected to the anode 141A of the first red sub-pixel region SPR1 and the anode 141B of the second red sub-pixel region SPR2, respectively. In this manner, the thin-film transistors 123 and 124 can drive the organic light-emitting element 140A of the first red sub-pixel region SPR1 and the organic light-emitting element 140B of the second red sub-pixel region SPR2, respectively. Alternatively, although not shown in FIG. 3, the anode 141A of the first red sub-pixel region SPR1 and the anode 141B of the second red sub-pixel region SPR2 may be electrically connected to a single thin-film transistor. In that instance, the organic light-emitting element 140A of the first red sub-pixel region SPR1 and the organic light-emitting element 140B of the second red sub-pixel region SPR2 may be driven by the single transistor to emit light simultaneously.

Consequently, in the sub-pixel regions which are immediately adjacent to each other with respect to the boundary line between the first pixel PX1 and the second pixel PX2, the organic light-emitting element 140A of the first red sub-pixel region SPR1 and the organic light-emitting element 140B of the second red sub-pixel region SPR2 emit red light. Accordingly, in the adjacent sub-pixel regions which are immediately adjacent to each other with respect to the boundary line between the pixels PX1 and PX2 adjacent to each other, organic light-emitting layers for emitting light of the same color can be disposed simultaneously. In other words, the width between openings of a mask can be sufficiently wide such that organic light-emitting layers for emitting the light of the same color can be disposed or formed simultaneously.

Referring to FIG. 3, a transmissive area TA1 is located near the second red sub-pixel region SPR2 in the second pixel PX2. In other words, a transmissive area TA1 is adjacent to the second red sub-pixel region SPR2 in the direction of the x-axis (i.e. row direction) on the opposite side to the first red sub-pixel region SPR1. In the transmissive area TA1, the bank layer or the overcoat layer 160 may not be formed. Therefore, the transmissive area TA1 transmits external light easily, providing the transparent OLED device 100 with transparency.

In the transparent OLED device 100 according to the exemplary embodiment of the present disclosure, for the single pixel PX1, two of the three sub-pixel regions included in the light-emitting area LA are disposed in parallel with each other whereas the other is disposed perpendicular to the two sub-pixel regions. In existing devices, each sub-pixel region includes a light-emitting area and a transmissive area, and each pixel includes three sub-pixel regions. Accordingly, each pixel includes three light-emitting areas and three transmissive areas, and thus a bank layer is formed between every two sub-pixel regions. As a result, the transmissive areas are narrow. In contrast, in the transparent OLED device 100 according to an exemplary embodiment of the present disclosure, the light-emitting area LA including the sub-pixel regions is disposed to surround the transmissive area TA1. Specifically, the light-emitting area LA including the sub-pixel regions which are in a single pixel is disposed to surround the transmissive area TA1 along three edges thereof. Accordingly, each pixel includes only one transmissive area TA1, and thus the size of the bank layer 150 interposed between sub-pixel regions in a single pixel is reduced. As a result, the transmissive area TA1 can be wider by as much as the reduced size of the bank layer 150.

In addition, in the transparent OLED device 100 according to an exemplary embodiment of the present disclosure, organic light-emitting layers for emitting light of the same color can be disposed simultaneously in the immediately adjacent two sub-pixel regions of two pixels immediately adjacent to each other in the horizontal direction, so that the two sub-pixel regions can emit light of the same color. Accordingly, the organic light-emitting layers for emitting light of the same color can be disposed at immediately adjacent pixels that are in parallel with and in horizontal direction to the long axis of an opening of the mask in the manner of sharing the opening of the mask, thereby disposing the organic light-emitting layers by a single and uniform process. Likewise, the organic light-emitting layers of the same color on the sub-pixels immediately adjacent to each other can be formed much wider than a conventional one to accommodate all the organic light-emitting layers of the same color on the sub-pixels immediately adjacent to each other sharing a single, straight opening of the mask. In addition, the width between openings of the mask used for deposition of the organic light-emitting layers can be widened.

Figure 4:
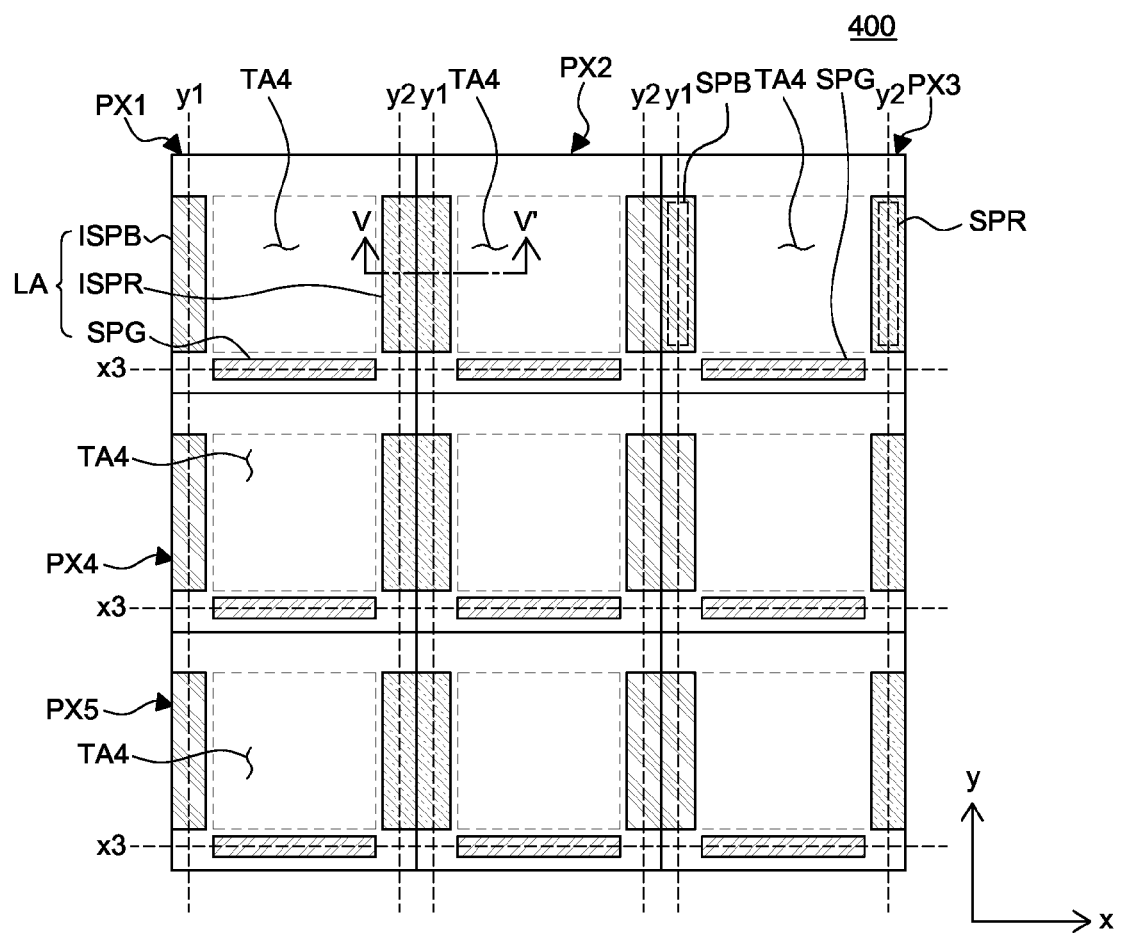
FIG. 4 is a schematic plan view illustrating a transparent OLED device according to another exemplary embodiment of the present disclosure.
Figure 5:
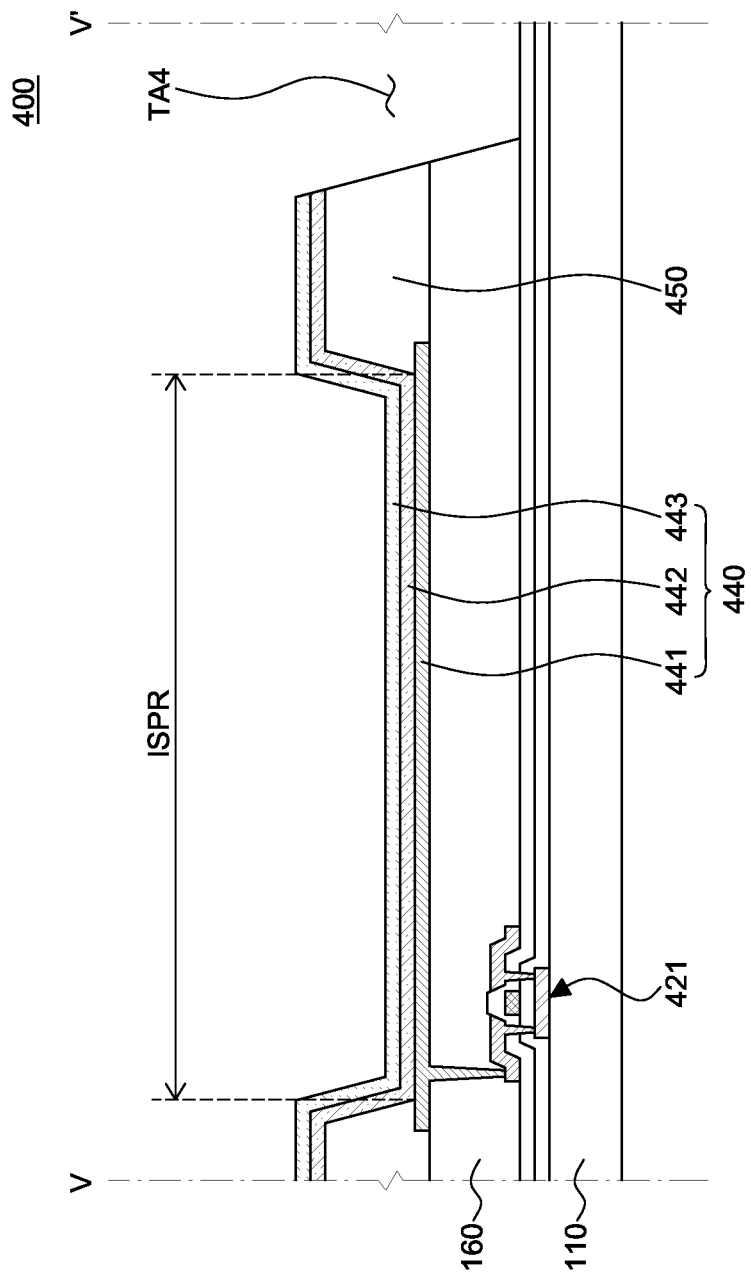
FIG. 5 is a cross-sectional view of the transparent OLED, taken along line V-V' of FIG. 4.

FIG. 4 is a schematic plan view illustrating a transparent OLED device according to another exemplary embodiment of the present disclosure. FIG. 5 is a cross-sectional view of the transparent OLED, taken along line V-V' of FIG. 4. The transparent OLED device 400 shown in FIG. 4 is substantially identical to the transparent OLED device 100 shown in FIG. 1 except for FIG. 4 includes integrated sub-pixel regions ISPB and ISPR; and, therefore, descriptions on the like elements will not be made again.

Referring to FIG. 4, the sub-pixel region disposed on a second line y2 of the first pixel PX1 and the sub-pixel region disposed on a first line y1 of the second pixel PX2 are integrated as a single sub-pixel region. Specifically, the red sub-pixel region SPR disposed on the second line y2 of the first pixel PX1 and the red sub-pixel region SPR disposed on the first line y1 of the second pixel PX2 are configured as a single, integrated red sub-pixel region ISPR. Accordingly, the first pixel PX1 and the second pixel PX2 adjacent to each other share the integrated red sub-pixel region ISPR. Namely, at the boundary between the first pixel PX1 and the second pixel PX2, the single red sub-pixel region ISPR emits red light.

Likewise, the blue sub-pixel regions SPBs of the second pixel PX2 and the third pixel PX3 immediately adjacent to each other may also be integrated as a single blue sub-pixel region ISPB. Accordingly, the second pixel PX2 and the third pixel PX3 immediately adjacent to each other share the integrated blue sub-pixel region ISPB. Namely, at the boundary between the second pixel PX2 and the third pixel PX3, the single blue sub-pixel region ISPB emits blue light.

Referring to FIG. 4, a transmissive area TA4 is disposed between integrated sub-pixel regions. Specifically, the transmissive area TA4 is disposed between the integrated red sub-pixel region ISPR and the integrated blue sub-pixel region ISPB. In other words, at least one of a plurality of the sub-pixel regions surrounding the transmissive area TA4 is an integrated sub-pixel region.

Referring to FIG. 5, an anode of an organic light-emitting element and a thin-film transistor driving the organic light-emitting element are disposed at both of the first pixel PX1 and the second pixel PX2. In other words, an anode 441 and a thin-film transistor 421 overlay from the first pixel PX1 to second pixel PX2. Specifically, at the boundary between the first pixel PX1 and the second pixel PX2, an anode 441 of an integrated red sub-pixel region ISPR is shared by them.

In addition, a thin-film transistor 421 is electrically connected to the anode 441 of the integrated red sub-pixel region ISPR. The anode 441 of the integrated red sub-pixel region ISPR is disposed over the edges of the first pixel PX1 and the second pixel PX2 immediately adjacent to the first pixel PX1. Corresponding to the region of an anode 441 in the integrated red sub-pixel region ISPR, a red sub-pixel SPR can be defined as areas that are not covered by the bank layer 450. An organic light-emitting layer 442 is disposed on the region of the anode 441 in the integrated red sub-pixel region ISPR. Like the anode 441 of the integrated red sub-pixel region ISPR, an organic light-emitting layer 442 of the integrated red sub-pixel region ISPR is disposed over an edge of the first pixel PX1 and an edge of the second pixel PX2 near an edge of the first pixel PX1. A cathode 443 of the red sub pixel region is disposed on the organic light-emitting layer of the red sub-pixel region. As a result, an organic light-emitting element 440 of the integrated red sub-pixel region ISPR is formed. Consequently, in the integrated red sub-pixel region ISPR at the boundary between the first pixel PX1 and the second pixel PX2, the single organic light-emitting element 440 of the red sub-pixel region is driven by the single thin-film transistor 421 so as to emit red light.

In the transparent OLED device 400 according to this exemplary embodiment of the present disclosure, one sub-pixel region is shared by two pixels immediately adjacent to each other, so that the two pixels emit light of the same color. Specifically, the integrated red sub-pixel region ISPR is continuously overlaid from an edge of the first pixel PX1 to an edge of the second pixel PX2. Further, the integrated blue sub-pixel region ISPB is disposed at the boundary between the second pixel PX2 and the third pixel PX3. In other words, the integrated blue sub-pixel region ISPB is continuously overlaid from an edge of the second pixel PX2 to an edge of the third pixel PX3. Accordingly, a single organic light-emitting element is shared by the pixels immediately adjacent to each other, and the pixels can use the single organic light-emitting element to emit light, respectively. Therefore, no bank layer to separate the pixels immediately adjacent to each other is required, so that the area of the sub-pixel regions is increased or the area of the transmissive area is increased. In other words, the size of the sub-pixel region is increased because the area of the anode 441 covered by the bank layer is decreased following the unification of two immediately adjacent sub-pixel regions of two immediately adjacent pixels. Accordingly, the overall light-emitting areas are increased and in turn the aperture ratio is improved, or the area of the transmissive area is increased and in turn the transparency of the transparent OLED device 400 is improved. As the aperture ratio is improved, the lifespan of the transparent OLED device 400 can also be increased.

Figure 6:
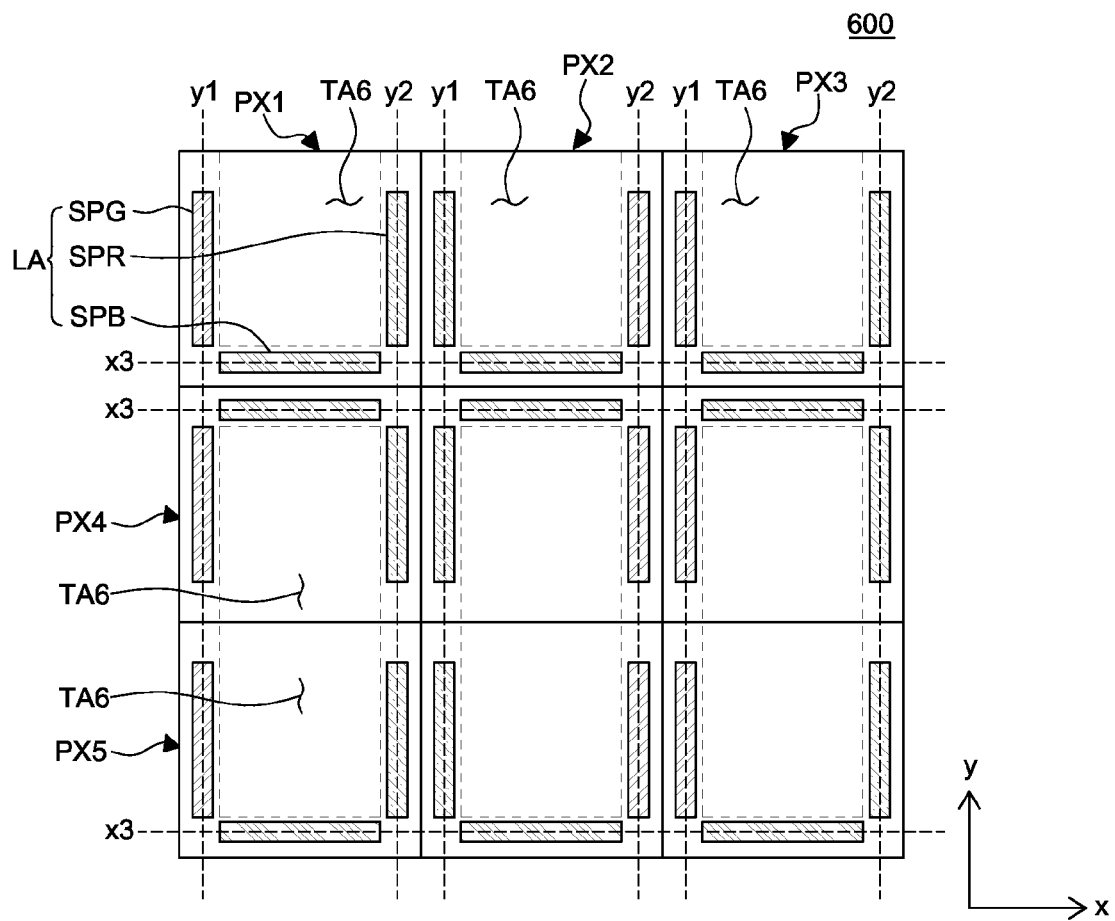
FIG. 6 is a schematic plan view illustrating a transparent OLED according to yet another exemplary embodiment of the present disclosure.

FIG. 6 is a schematic plan view for illustrating a transparent OLED according to yet another exemplary embodiment of the present disclosure. The transparent OLED device 600 shown in FIG. 6 is substantially identical to the transparent OLED device 100 shown in FIG. 1 except for the difference in the location of the sub-pixel region that is disposed on the third line x3 and the shape of the transmissive area; and, therefore, descriptions on the like elements will not be made again.

Referring to FIG. 6, in the first pixel PX1, the fourth pixel PX4 and the fifth pixel PX5 which are a plurality of pixels arranged in the direction of the y-axis, the green sub-pixel region SPG is disposed on the first line y1, the red sub-pixel region SPR is disposed on the second line y2, and the blue sub-pixel region SPB is disposed on the third line x3. In the second pixel PX2 which is immediately adjacent to the first pixel PX1 in the direction of the x-axis, the red sub-pixel region SPR is disposed on the first line y1, the green sub-pixel region SPG is disposed on the second line y2, and the blue sub-pixel region SPB is disposed on the third line x3. Namely, in each of the pixels, the blue sub-pixel region SPB is disposed along the third line x3, the red sub-pixel region SPR is disposed along the second line y2, and the green sub-pixel region SPG is disposed along the first line y1. Or, in each of the pixels, the red sub-pixel region SPR is disposed along the first line y1, the green sub-pixel region SPG is disposed along the second line y2, and the green sub-pixel region SPG is disposed along the third line x3. Accordingly, in each of the pixels, the blue sub-pixel region SPB are in parallel with the red sub-pixel region SPR, while the green sub-pixel region SPG is perpendicular to the blue sub-pixel region SPB and the red sub-pixel region SPR.

Referring to FIG. 6, a fourth pixel PX4 is immediately adjacent to the first pixel PX1 in the vertical direction, and a fifth pixel PX5 is immediately adjacent to the fourth pixel PX4 in the vertical direction. A blue sub-pixel region SPB of the first pixel PX1 and a blue sub-pixel region SPB of the fourth pixel PX4, which are adjacent to each other with respect to the boundary line between the first pixel PX1 and the fourth pixel PX4, may emit light of the same color. A blue sub-pixel region SPB of the fourth pixel PX4 and a blue sub-pixel region SPB of the fifth pixel PX5, which are immediately adjacent to each other with respect to the boundary line between the fourth pixel PX4 and the fifth pixel PX5, may emit light of the same color. Specifically, as shown in FIG. 6, the blue sub-pixel region SPB of the fourth pixel PX4 is disposed immediately adjacent to the blue sub-pixel region SPB of the first pixel PX1, and the blue sub-pixel region SPB of the fourth pixel PX4 is disposed immediately adjacent to the blue sub-pixel region SPB of the fifth pixel PX5.

Referring to FIG. 6, each of the blue sub-pixel regions SPBs on the x-axis is disposed immediately adjacent to each other with respect to the boundary line between two pixels immediately adjacent to each other in the y-direction (e.g., in the vertical direction or column direction). As a result, there is formed a integrated, wide transmissive area TA6. Specifically, as the two blue sub-pixel regions SPBs are disposed such that they are close to the boundary line between the first pixel PX1 and the fourth pixel PX4, a blue sub-pixel region SPB of the fifth pixel PX5 adjacent to the fourth pixel PX4 in the vertical direction is disposed distant from the boundary line between the fourth pixel PX4 and the fifth pixel PX5. In other words, there is no sub-pixel region near the boundary line between the fourth pixel PX4 and fifth pixel PX5 and a blue sub-pixel region SPB of the fifth pixel PX5 is disposed adjacent, but not directly close, to a blue sub-pixel region SPB of the fourth pixel PX4. Namely, the transmissive area TA6 is formed at the boundary line between the fourth pixel PX4 and the fifth pixel PX5. Accordingly, there is formed the wide transmissive area TA6 in the range from the fourth pixel PX4 to the fifth pixel PX5 continuously. In other words, the transmissive area TA6 is continuously overlaid from both of the fourth pixel PX4 and the fifth pixel PX5.

In the transparent OLED device 600 according to this exemplary embodiment of the present disclosure, sub-pixel regions are disposed closely to the boundary line between pixels adjacent to each other in the vertical direction, so that an integrated, wide transmissive area can be obtained. Specifically, the blue sub-pixel regions SPBs are disposed such that they are close to the boundary line between the first pixel PX1 and the fourth pixel PX4 adjacent to each other in the direction of the first line y1, and accordingly no sub-pixel region i.e., no light-emitting area, is disposed near the boundary line between the fourth pixel PX4 and the fifth pixel PX5. When two sub-pixel regions of two different pixels PX1 and PX4 are disposed such that they are close to the boundary line between the first pixel PX1 and the fourth pixel PX4, no sub-pixel region exists near the boundary line between the fourth pixel PX4 and the fifth pixel PX5 immediately adjacent to each other in the direction of the y-axis. In other words, for a plurality of pixels arranged in the direction of the y-axis (column direction), sub-pixel regions are disposed alternatively near every other boundary line between the pixels perpendicular to y-axis. The sub-pixel regions are disposed closely to the boundary lines between the pixels such that one axis of one of the sub-pixel regions may be parallel with one axis of the other, and may be perpendicular to the first line y1. In particular, the one axis of each of the sub-pixel regions may be the major axis thereof which may be a part of the third line x3. Accordingly, the transmissive area TA6 is continuously disposed at the boundary line between the fourth pixel PX4 and the fifth pixel PX5 and thus the area of the transmissive area TA6 greatly widens. As the transmissive area TA6 widens, the aperture ratio of the transmissive area TA6 and the transmissivity of the transparent OLED device 600 are also improved.

Figure 7:
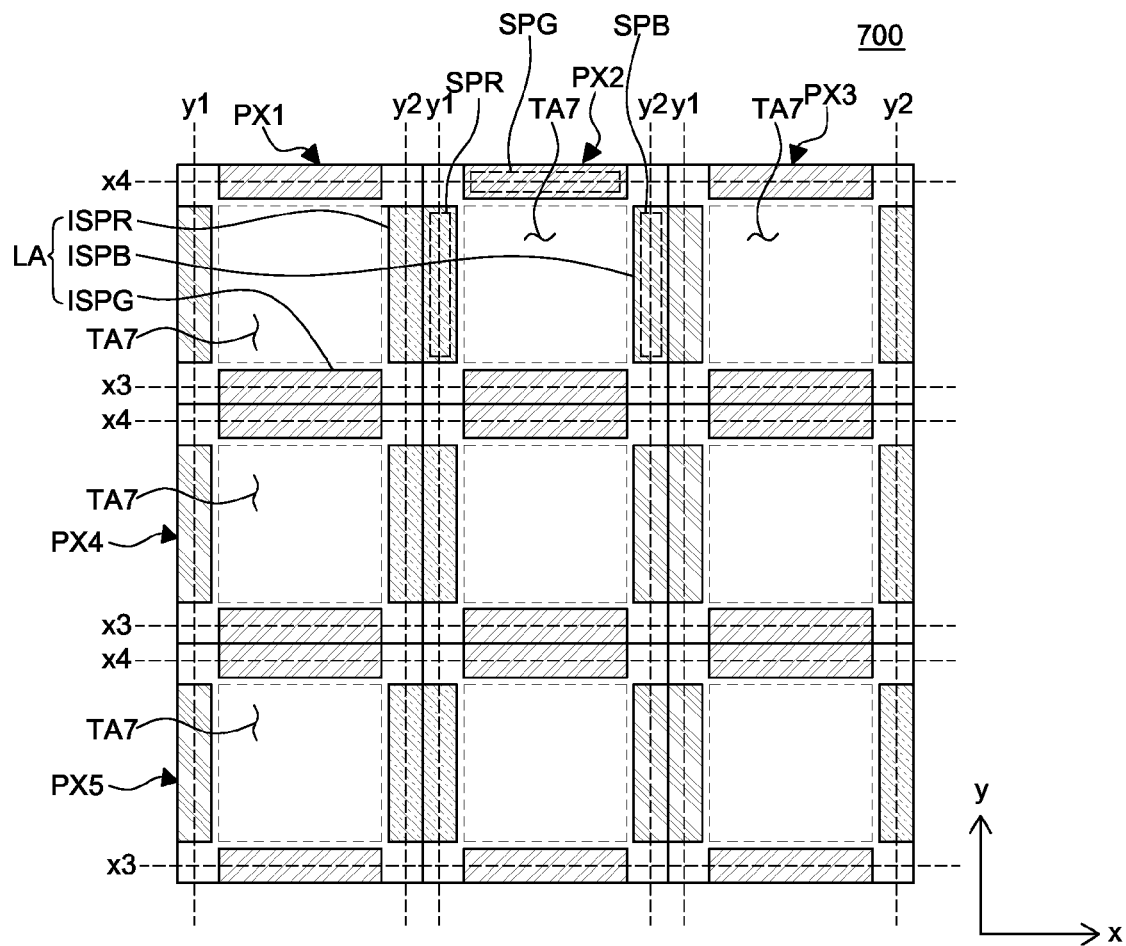
FIG. 7 is a schematic plan view illustrating a transparent OLED according to still another exemplary embodiment of the present disclosure.

FIG. 7 is a schematic plan view illustrating a transparent OLED device according to still another exemplary embodiment of the present disclosure. The transparent OLED device 700 shown in FIG. 7 is substantially identical to the transparent OLED device 400 shown in FIG. 4 except for that the former further includes a green sub-pixel region disposed on a fourth line x4 and that an integrated sub-pixel region ISPG is employed instead of the green sub-pixel regions SPGs; and, therefore, descriptions on the like elements will not be made again.

Referring to FIG. 7, in a first pixel PX1, a green sub-pixel region SPG is disposed on a fourth line x4. Specifically, the fourth line x4 is defined as an axis parallel with the third line x3. The green sub-pixel region SPG is additionally disposed on the fourth line x4. Namely, green sub-pixel regions are disposed on the third line x3 and the fourth line x4, respectively. Accordingly, a transmissive area TA7 of the first pixel PX1 is surrounded by a blue sub-pixel region SPB, a red sub-pixel region SPR, and two green sub-pixel regions SPGs in the pixel PX1.

Referring to FIG. 7, the sub-pixel region disposed on the third line x3 of the first pixel PX1 and the sub-pixel region disposed on the fourth line x4 of the fourth pixel PX4 are integrated as a single sub-pixel region. Specifically, the green sub-pixel region SPG of the fourth pixel PX4 and the green sub-pixel region SPG of the first pixel PX1 are configured as a single, integrated green sub-pixel region ISPG. Accordingly, the first pixel PX1 and the fourth pixel PX4 share the integrated green sub-pixel region ISPG at the boundary line. Namely, at the boundary line between the first pixel PX1 and the fourth pixel PX4 adjacent to each other, the single green sub-pixel region emits green light.

In the integrated green sub-pixel region ISPG, an integrated anode of an organic light-emitting element may be formed from the green sub-pixel region SPG of the first pixel PX1 to the green sub-pixel region SPG of the fourth pixel PX4. A thin-film transistor is electrically connected to the integrated anode. An organic light-emitting layer and a cathode are formed on the integrated anode as single-layers.

An anode of the green sub-pixel region is disposed over the boundary line between the first pixel PX1 and the fourth pixel PX4 immediately adjacent to the first pixel PX1. An organic light-emitting layer is disposed on the region of the anode in the green sub-pixel region. Like the anode of the green sub-pixel region, an organic light-emitting layer of the green sub-pixel region is disposed over the boundary line between the first pixel PX1 and the fourth pixel PX4 near an edge of the first pixel PX1. A cathode of the green sub pixel region is disposed on the organic light-emitting layer of the green sub-pixel region. Accordingly, an integrated organic light-emitting element emitting green light can be formed both at the first pixel PX1 and the fourth pixel PX4. In other words, an integrated organic light-emitting element emitting green light overlays from the first pixel PX1 to the fourth pixel PX4.

In the transparent OLED device 700 according to this exemplary embodiment of the present disclosure, an integrated sub-pixel region is disposed also at the boundary line between pixels adjacent to each other in the direction of the y-axis. Specifically, two sub-pixel regions disposed close to the boundary line between the first pixel PX1 and the fourth pixel PX4 are integrated as a single sub-pixel region. In the integrated sub-pixel region, an integrated organic light-emitting element is disposed such that it includes an integrated anode disposed from the first pixel PX1 to the fourth pixel PX4, an organic light-emitting layer and a cathode configured as single-layers. An anode of one sub-pixel region is disposed over the interfacing two edges of the first pixel PX1 and the fourth pixel PX4 immediately adjacent to the first pixel PX1. An organic light-emitting layer is disposed on the region of the anode in the one sub-pixel region. Like the anode of the one sub-pixel, an organic light-emitting layer of the one sub-pixel region is disposed over an edge of the first pixel PX1 and an edge of the fourth pixel PX4 near the edge of the first pixel PX1. A cathode of the one sub pixel region is disposed on the organic light-emitting layer of the one sub-pixel region. Accordingly, the integrated sub-pixel region at the boundary line between the first pixel PX1 and the fourth pixel PX4 emit light of a color. In this manner, the integrated sub-pixel region disposed between the first pixel PX1 and the fourth pixel PX4 can provide a wider light-emitting area than that of existing ones. Accordingly, the aperture ratio of the light-emitting area as well as the aperture ratio of the transmissive area in the transparent OLED 700 can be improved.

FIGS. 8A to 8D are plan views illustrating the processes of a method of manufacturing a transparent OLED device according to an exemplary embodiment of the present disclosure. FIGS. 8A to 8D are plan view illustrating processes of a method of manufacturing the transparent OLED device shown in FIG. 6. The elements described above with respect to FIG. 6 will not be described again.

Initially, a substrate having a first pixel PX1 and a second pixel PX2 adjacent to the first pixel PX1 in the direction of the x-axis (e.g., row direction) defined thereon is prepared. Each of the first pixel PX1 and the second pixel PX2 includes: a first sub-pixel region SP1 disposed on a first line y1; a second sub-pixel region SP2 disposed on a second line y2 parallel with the first line y1; a third sub-pixel region SP3 disposed on a third line x3 extending in a different direction from which the first line y1 and the second line y2 are extended; and a transmissive area TA surrounded by the first sub-pixel region SP1, the second sub-pixel region SP2 and the third sub-pixel region SP3. Subsequently, an anode is formed in each of the first sub-pixel region SP1, the second sub-pixel region SP2 and the third sub-pixel region SP3 of the first pixel PX1 and those of the second pixel PX2.

Figure 8A:
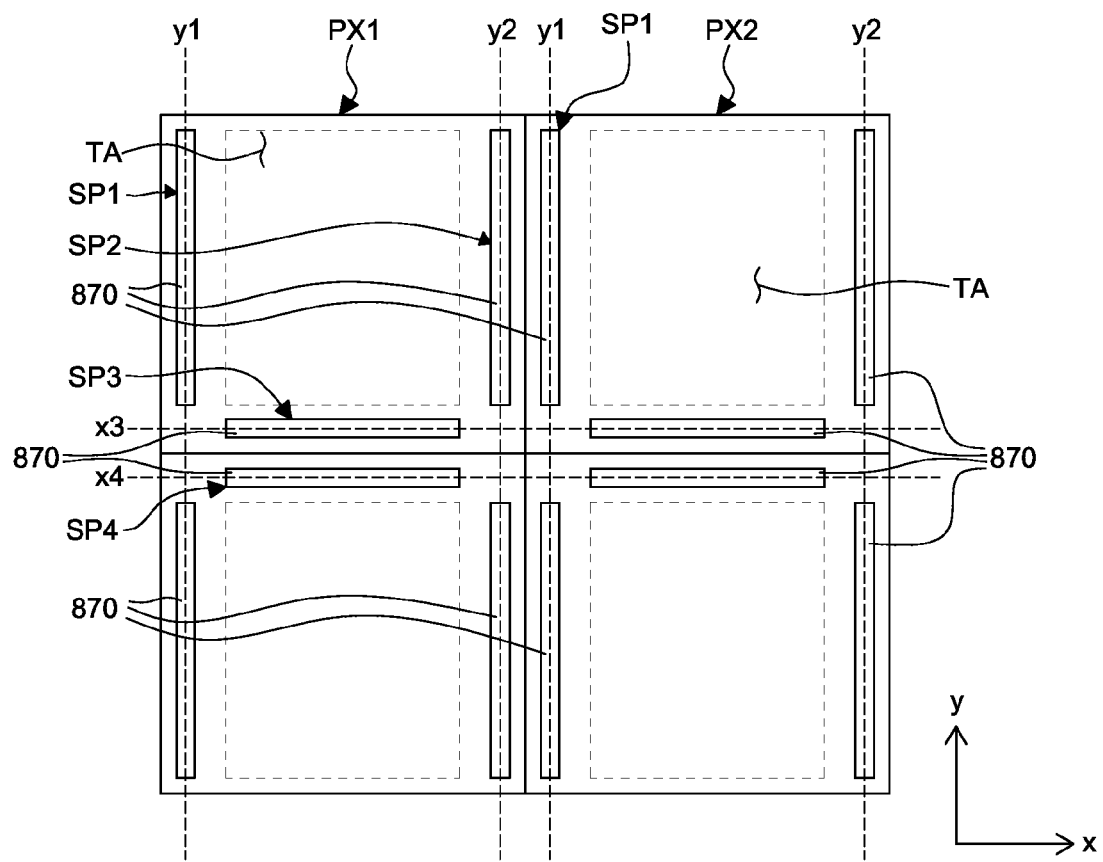
FIGS. 8A to 8D are plan views illustrating the process of a method of manufacturing a transparent OLED according to another exemplary embodiment of the present disclosure.

Referring to FIG. 8A, the first sub-pixel region SP1, the second sub-pixel region SP2 and the third sub-pixel region SP3 are disposed on the first line y1, the second line y2 and the third line x3, respectively. A thin-film transistor may be formed in each of the first sub-pixel region SP1, the second sub-pixel region SP2 and the third sub-pixel region SP3. After the thin-film transistor is formed, an overcoat layer for covering an uneven top surface of the thin film transistors is disposed. On a flattened top surface of the overcoat layer, an anode electrically connected to the respective thin-film transistor is formed in each of the first sub-pixel region SP1, the second sub-pixel region SP2 and the third sub-pixel region SP3. In other words, in each of the first sub-pixel region SP1, the second sub-pixel region SP2 and the third sub-pixel region SP3, a thin-film transistor and an anode electrically connected to the thin-film transistor are formed.

In this regard, the same thin-film transistor may be electrically connected to the anodes 870 of the first pixel PX1 and the second pixel PX2 immediately adjacent to the first pixel PX1. Specifically, the anode 870 formed in the second sub-pixel region SP2 of the first pixel PX1 and the anode 870 formed in the first sub-pixel region SP1 of the second pixel PX2 may be electrically connected to the same thin-film transistor.

In addition, the anode 870 formed in the second sub-pixel region SP2 of the first pixel PX1 and the anode 870 formed in the first sub-pixel region SP1 of the second pixel PX2 may be integrated as a single anode. In that instance, an integrated anode may be disposed at the boundary line between the first pixel PX1 and the second pixel PX2, and a thin-film transistor may be connected to the integrated anode.

Subsequently, a first organic light-emitting layer is formed on the anode 870 of the first sub-pixel region SP1 of the first pixel PX1 and the anode 870 of the second sub-pixel region SP2 of the second pixel PX2.

Figure 8B:
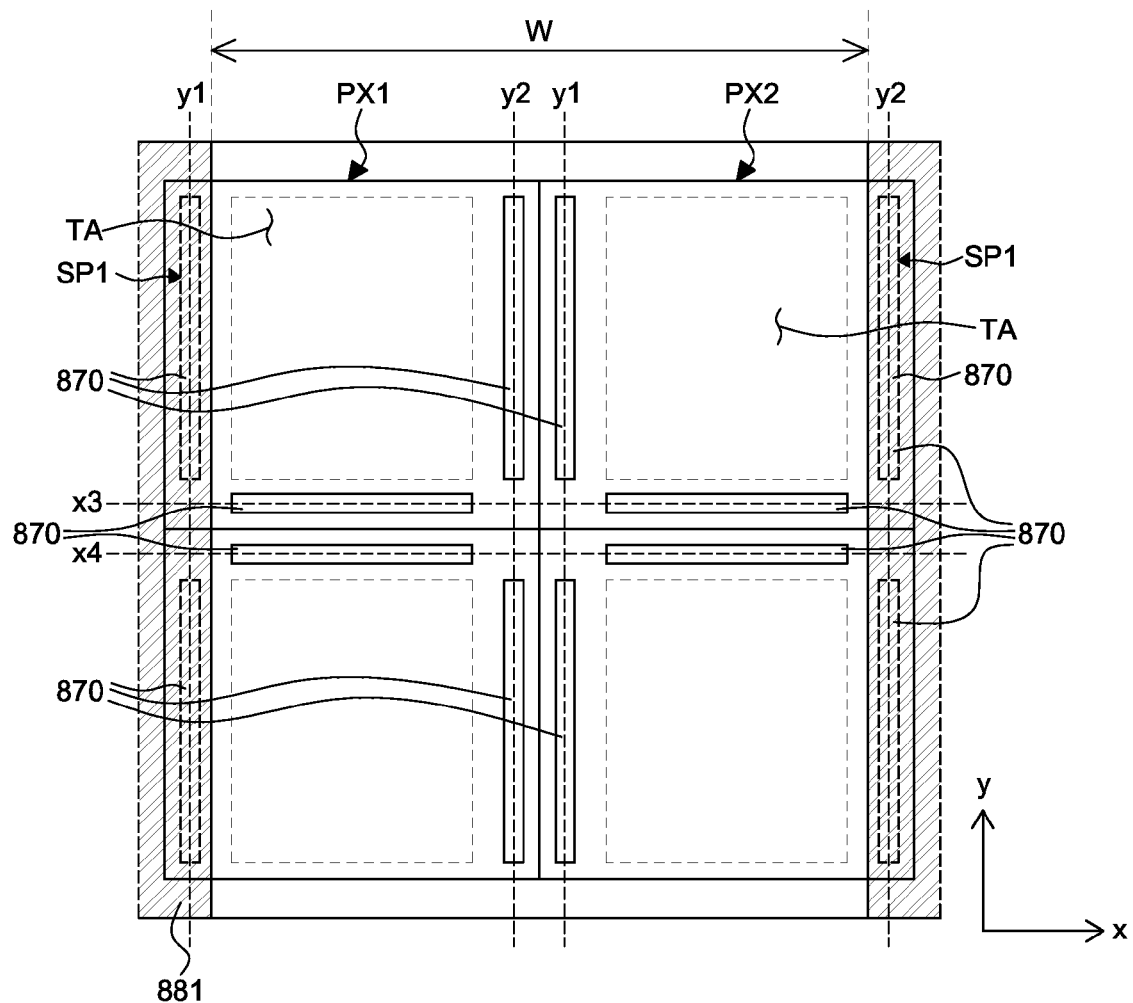

Referring to FIG. 8B, openings of a mask 881 for deposition of a green organic light-emitting layer is placed in line with the anode 870 of the first sub-pixel region SP1 on the first line y1. Then, a material for a green organic light-emitting layer is deposited on the anode 870 of the first sub-pixel region SP1 through the openings of the mask 881. As a result, a green organic light-emitting layer is formed in the first sub-pixel region SP1 of the first pixel PX1 and the second sub-pixel region SP2 of the second pixel PX2.

As can be seen from FIG. 8B, the wide width w between openings of the mask 881 can be widened. Specifically, the gap between the first sub-pixel region SP1 of the first pixel PX1 and the second sub-pixel region SP2 of the second pixel PX2 is as wide as the transmissive area TA in the first pixel PX1 and the second pixel PX2. Accordingly, the width w between the openings of the mask 881 for deposition of a green organic light-emitting layer can be approximately as wide as the sum of the widths of the first pixel PX1 and the second pixel PX2.

Subsequently, a second organic light-emitting layer is formed on the anode 870 of the second sub-pixel region SP2 of the first pixel PX1 and the anode 870 of the first sub-pixel region SP1 of the second pixel PX2.

Figure 8C:
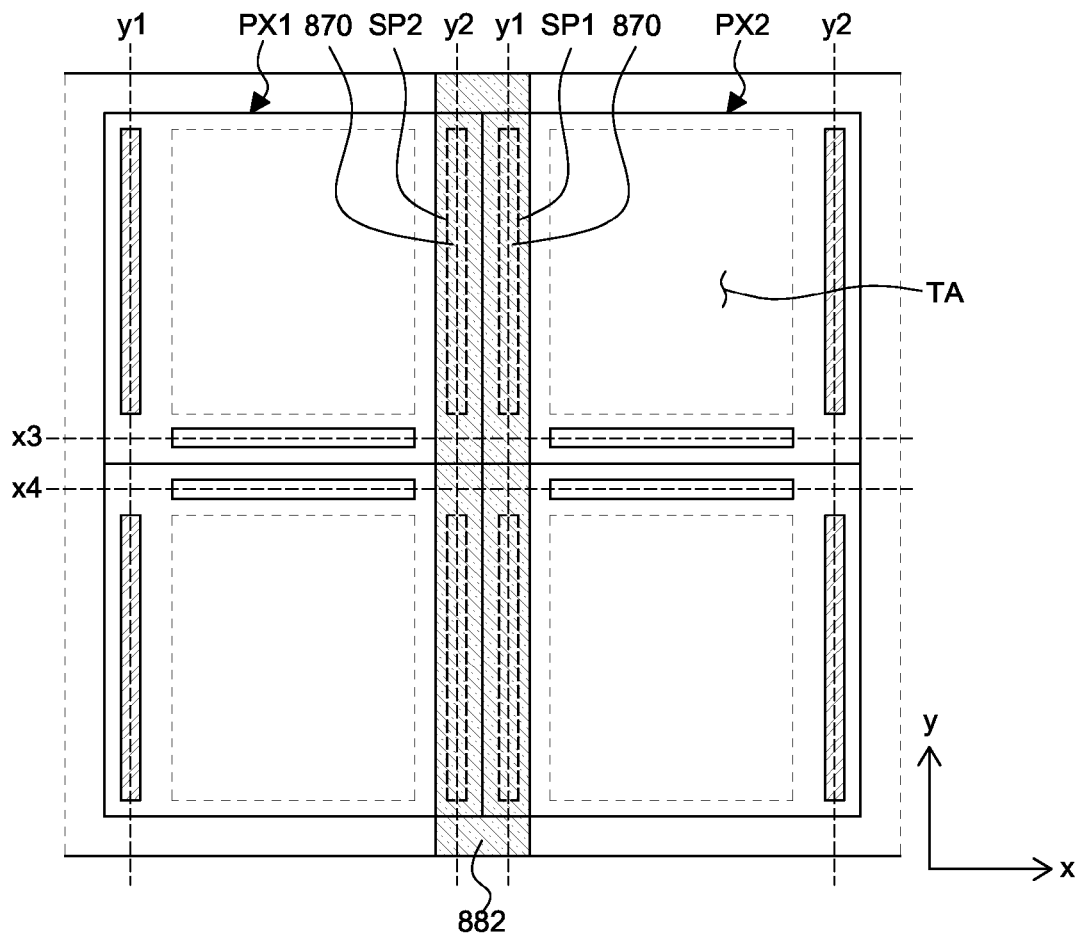

Referring to FIG. 8C, an opening of a mask 882 for deposition of a red organic light-emitting layer is placed in line with the anode 870 of the second sub-pixel region SP2 of the first pixel PX1 on the second line y2 and the anode 870 of the first sub-pixel region SP1 of the second pixel PX2 on the first line y1. Then, a material for a red organic light-emitting layer is deposited on the anode 870 of the second sub-pixel region SP2 of the first pixel PX1 and the anode 870 of the first sub-pixel region SP1 of the second pixel PX2 through openings of mask 882. As a result, a red organic light-emitting layer is formed on the second sub-pixel region SP2 of the first pixel PX1 and the first sub-pixel region SP1 of the second pixel PX2.

Specifically, the opening of the mask 882 may be a single opening that covers both the second sub-pixel region SP2 of the first pixel PX1 and the first sub-pixel region SP1 of the second pixel PX2 such that the organic light-emitting layer disposed in the second sub-pixel region SP2 of the first pixel PX1 and the organic light-emitting layer disposed in the first sub-pixel region SP1 of the second pixel PX2 can be formed immediately adjacent to each other. Accordingly, a material for a red organic light-emitting layer is deposited on the anode 870 of the second sub-pixel region SP2 of the first pixel PX1 and the anode 870 of the first sub-pixel region SP1 of the second pixel PX2 through a single opening that covers the second sub-pixel region SP2 of the first pixel PX1 and the first sub-pixel region SP1 of the second pixel PX2.

Subsequently, a third organic light-emitting layer is formed on the anode 870 of the third sub-pixel region SP3 of the first pixel PX1 and that of the second pixel PX2.

Figure 8D:
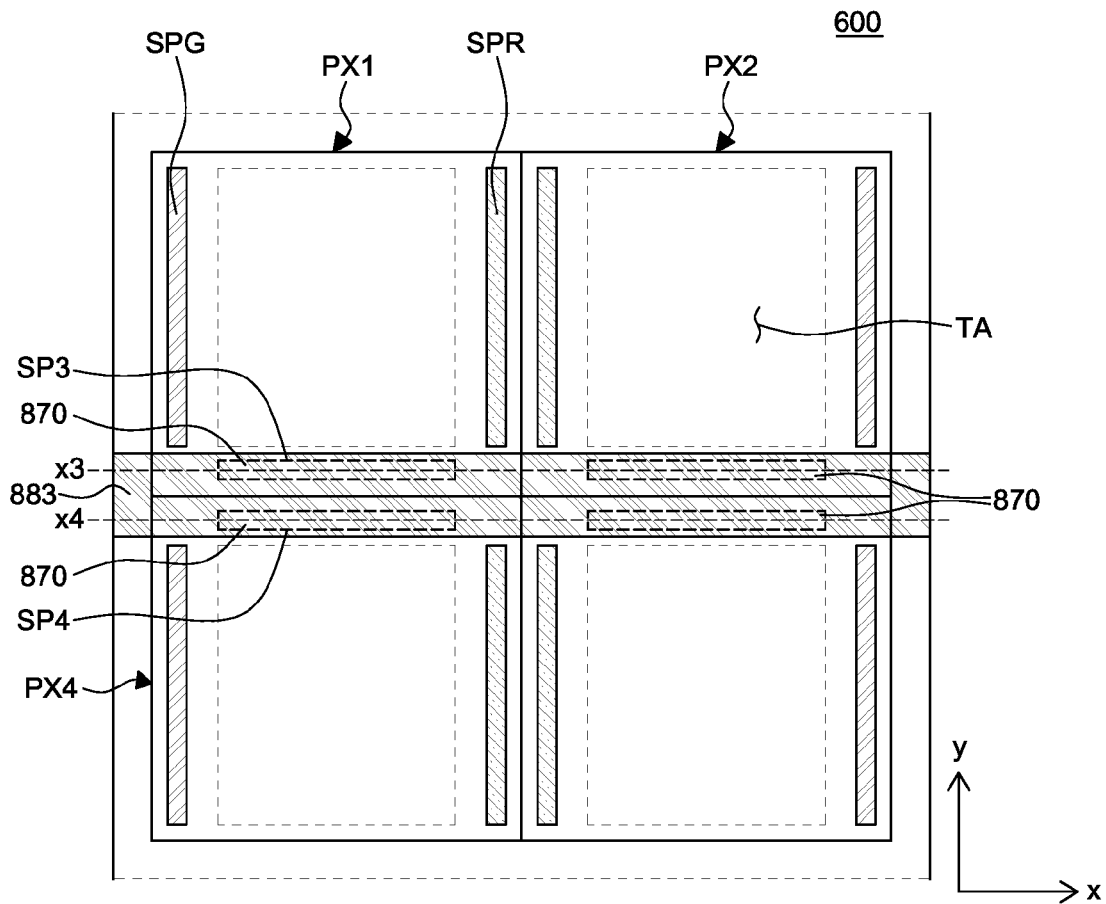

Referring to FIG. 8D, an opening of a mask 883 for deposition of a blue organic light-emitting layer is placed in line with the anode 870 of the third sub-pixel region SP3 on the third line x3. Then, a material for a blue organic light-emitting layer is deposited on the anode 870 of the third sub-pixel region SP3 through openings of the mask 883. As a result, a blue organic light-emitting layer is formed on the third sub-pixel region SP3 of the first pixel PX1.

In this regard, like the red organic light-emitting layer, the blue organic light-emitting layer may also be deposited on the anode 870 of the third sub-pixel region SP3 of the first pixel PX1 and the anode 870 of the fourth sub-pixel region SP4 of the fourth pixel PX4 through a single opening of the mask 883 that covers the third sub-pixel region SP3 of the first pixel PX1 and the fourth sub-pixel region SP4 of the fourth pixel PX4. Accordingly, the blue organic light-emitting layer can be formed simultaneously in the third sub-pixel region SP3 of the first pixel PX1 and the fourth sub-pixel region SP4 of the fourth pixel PX4.

It is to be noted that the order in which the green, red and blue organic light-emitting layers are formed may vary depending on embodiments, and is not limited by those described herein.

Subsequently, a cathode is formed on each of the first, second and third organic light-emitting layers.

In a method of manufacturing a transparent OLED according to an exemplary embodiment of the present disclosure, a mask for deposition of an organic light-emitting layer can have a larger width between openings. In existing light-emitting areas arranged in a stripe pattern, the distance between light-emitting areas of the same color corresponds to the width of a pixel. Accordingly, the width between openings of the mask also corresponds to the width of a pixel. In contrast, according to the present disclosure, the distance between light-emitting areas of the same color is twice the width of a pixel. Accordingly, the width between openings of a mask for deposition of an organic light-emitting layer becomes wider accordingly. In other words, the distance between the light emitting areas of a same color is larger than twice a width of the transmissive areas therebetween.

In addition, in the method of manufacturing a transparent OLED according to an exemplary embodiment of the present disclosure where the width between openings of the mask is large, the resolution of the transparent OLED 600 can be increased by reducing the width between the openings of the mask to form the sub-pixel regions. Specifically, by reducing the width between the openings of the mask to be used in an existing stripe pattern, the sub-pixel regions can be disposed more densely. As a result, the resolution of the transparent OLED device 600 can greatly increase.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present invention. The technical idea of the present invention is not limited by the exemplary embodiments. The scope of protection sought by the present disclosure is defined by the appended claims and all equivalents thereof are construed to be within the true scope of the present disclosure.

A transparent organic light-emitting display (OLED) device, comprising: a substrate having a plurality of pixels, each pixel including: a light emitting area including a first sub-pixel region, a second sub-pixel region, and a third sub-pixel region, each of the sub-pixel regions configured to emit light of a different color from each other; and a transmissive area through which external light passes, wherein the light emitting area surrounds the transmissive area with the first sub-pixel region extended along a first edge of the transmissive area, the second sub-pixel region extended along a second edge of the transmissive area, and the third sub-pixel region extended along a third edge of the transmissive area.

In the transparent OLED device, the first sub-pixel region and the second sub-pixel region are parallel to each other.

The transparent OLED device further comprises a bank layer at a periphery of each of the sub-pixel regions, wherein the bank layer covers a side end of an anode corresponding to each sub-pixel regions connected to one of the plurality of thin film transistors on the substrate.

In the transparent OLED device, each of the sub-pixel regions emit one of red light, blue light, and green light.

In the transparent OLED device, the second sub-pixel region of a first pixel and the first sub-pixel region of a second pixel immediately adjacent the first pixel in a row direction form a single integrated sub-pixel region.

In the transparent OLED device, the second sub-pixel region of the second pixel and the first sub-pixel region of a third pixel immediately adjacent the second pixel in the row direction on the opposite side to the first pixel form a single integrated sub-pixel region.

In the transparent OLED device, the transmissive area is between the integrated sub-pixel regions in the row direction.

In the transparent OLED device, the second sub-pixel region of a first pixel and the first sub-pixel region of a second pixel immediately adjacent the first pixel in the row direction emit the same color.

In the transparent OLED device, an anode of the second sub-pixel region of the first pixel and an anode of the first sub-pixel region of a second pixel immediately adjacent the first pixel in the row direction are connected to a single driving transistor.

The transparent OLED device further includes a fourth sub-pixel region arranged in the row direction, wherein the fourth sub-pixel region emits a light of a different color from the first and second sub-pixel regions, and the fourth sub-pixel region and the third sub-pixel region are on opposite sides of the transmissive area.

In the transparent OLED device, the third sub-pixel region of a first pixel and the third sub-pixel region of a fourth pixel immediately adjacent the first pixel in the column direction form a single integrated sub-pixel region.

In the transparent OLED device, pixels immediately adjacent to each other along one of the column and row direction share a single integrated sub-pixel region at the boundary line between the pixels, the single integrated sub-pixel region including one among the first, second and third sub-pixel regions.

In the transparent OLED device, the direction of the major axis of the integrated sub-pixel region cross the said one of the column and row direction.

In the transparent OLED device, the integrated sub-pixel regions are on opposite sides of the transmissive area.

In the transparent OLED device, the two interfacing sub-pixel regions which are located on each edge of two pixels immediately adjacent to each other emit the same color.

In the transparent OLED device, the two interfacing sub-pixel regions which are located on each edge of two pixels immediately adjacent to each other emit light simultaneously.

In the transparent OLED device, two anodes of each of said two interfacing sub-pixel regions are connected to a single driving transistor.

In the transparent OLED device, transmissive areas of two pixels immediately adjacent each other are integrated with no sub-pixel region at a boundary between the two pixels.

In the transparent OLED device, said transmissive areas of two pixels immediately adjacent each other form a single integrated transmissive area, with all edges of the integrated transmissive area surrounded by the sub-pixel regions.

What is claimed:

1. A transparent organic light-emitting display (OLED) device, comprising:
   a substrate having a plurality of pixels, each pixel including:
   a light emitting area including a first sub-pixel region, a second sub-pixel region, and a third sub-pixel region, each of the sub-pixel regions configured to emit light of a different color from each other; and
   a transmissive area through which external light passes, wherein the light emitting area surrounds the transmissive area with the first sub-pixel region extended along a first edge of the transmissive area, the second sub-pixel region extended along a second edge of the transmissive area, and the third sub-pixel region extended along a third edge of the transmissive area, and
   wherein the second sub-pixel region of a first pixel and the first sub-pixel region of a second pixel immediately adjacent the first pixel in a row direction form a single integrated sub-pixel region.

2. The transparent OLED device of claim 1, wherein the first sub-pixel region and the second sub-pixel region are parallel to each other.

3. The transparent OLED device of claim 2, further comprising a bank layer at a periphery of each of the sub-pixel regions, wherein the bank layer covers a side end of an anode corresponding to each sub-pixel regions connected to one of a plurality of thin film transistors on the substrate.

4. The transparent OLED device of claim 1, wherein each of the sub-pixel regions emit one of red light, blue light, and green light.

5. The transparent OLED device of claim 1, wherein the second sub-pixel region of the second pixel and the first sub-pixel region of a third pixel immediately adjacent the second pixel in the row direction on the opposite side to the first pixel form a single integrated sub-pixel region.

6. The transparent OLED device of claim 5, wherein the transmissive area is between the integrated sub-pixel regions in the row direction.

7. The transparent OLED device of claim 2, wherein the second sub-pixel region of a first pixel and the first sub-pixel region of a second pixel immediately adjacent the first pixel in the row direction emit the same color.

8. The transparent OLED device of claim 2, wherein an anode of the second sub-pixel region of the first pixel and an anode of the first sub-pixel region of a second pixel immediately adjacent the first pixel in the row direction are connected to a single driving transistor.

9. The transparent OLED device of claim 4, further including a fourth sub-pixel region arranged in the row direction, wherein the fourth sub-pixel region emits a light of a different color from the first and second sub-pixel regions, and the fourth sub-pixel region and the third sub-pixel region are on opposite sides of the transmissive area.

10. The transparent OLED device of claim 1, wherein the third sub-pixel region of a first pixel and the third sub-pixel region of a fourth pixel immediately adjacent the first pixel in the column direction form a single integrated sub-pixel region.

11. The transparent OLED device of claim 4, wherein two interfacing sub-pixel regions which are located on each edge of two pixels immediately adjacent to each other emit the same color.

12. The transparent OLED device of claim 4, wherein the two interfacing sub-pixel regions which are located on each edge of two pixels immediately adjacent to each other emit light simultaneously.

13. The transparent OLED device of claim 12, wherein two anodes of each of said two interfacing sub-pixel regions are connected to a single driving transistor.

14. The transparent OLED device of claim 1, wherein transmissive areas of two pixels immediately adjacent each other are integrated with no sub-pixel region at a boundary between the two pixels.

15. The transparent OLED device of claim 14, wherein said transmissive areas of two pixels immediately adjacent each other form a single integrated transmissive area, with all edges of the integrated transmissive area surrounded by the sub-pixel regions.

16. A transparent organic light-emitting display (OLED) device, comprising:
   a substrate having a plurality of pixels, each pixel including:
   a light emitting area including a first sub-pixel region, a second sub-pixel region, and a third sub-pixel region, each of the sub-pixel regions configured to emit light of a different color from each other; and
   a transmissive area through which external light passes, wherein the light emitting area surrounds the transmissive area with the first sub-pixel region extended along a first edge of the transmissive area, the second sub-pixel region extended along a second edge of the transmissive area, and the third sub-pixel region extended along a third edge of the transmissive area, and wherein pixels immediately adjacent to each other along one of the column and row direction share a single integrated sub-pixel region at the boundary line between the pixels, the single integrated sub-pixel region including one among the first, second and third sub-pixel regions.

17. The transparent OLED device of claim 16, wherein the direction of the major axis of the integrated sub-pixel region cross the said one of the column and row direction.

18. The transparent OLED device of claim 16, wherein the integrated sub-pixel regions are on opposite sides of the transmissive area.

\* \* \* \* \*